(12) United States Patent
Fu

(10) Patent No.: US 9,864,246 B2
(45) Date of Patent: Jan. 9, 2018

(54) ARRAY SUBSTRATE AND DISPLAY DEVICE

(71) Applicant: Shenzhen China Star Optoelectronics Technology Co., Ltd., Shenzhen, Guangdong (CN)

(72) Inventor: Yanfeng Fu, Guangdong (CN)

(73) Assignee: Shenzhen China Star Optoelectronics Technology Co., LTd., Shenzhen, Guangdong (CN)

( * ) Notice: Subject to any disclaimer, the term of this patent is extended or adjusted under 35 U.S.C. 154(b) by 69 days.

(21) Appl. No.: 14/785,964

(22) PCT Filed: May 22, 2015

(86) PCT No.: PCT/CN2015/079599
§ 371 (c)(1),
(2) Date: Dec. 30, 2015

(87) PCT Pub. No.: WO2016/173025
PCT Pub. Date: Nov. 3, 2016

(65) Prior Publication Data
US 2017/0192327 A1 Jul. 6, 2017

(30) Foreign Application Priority Data
Apr. 27, 2015 (CN) .......................... 2015 1 0204304

(51) Int. Cl.
*G02F 1/1362* (2006.01)
*G02F 1/1335* (2006.01)
(Continued)

(52) U.S. Cl.
CPC .... *G02F 1/136286* (2013.01); *G02F 1/13439* (2013.01); *G02F 1/133514* (2013.01);
(Continued)

(58) Field of Classification Search
CPC ......... G02F 1/136286; G02F 1/133514; G02F 1/13439; G02F 1/133345;
(Continued)

(56) References Cited

U.S. PATENT DOCUMENTS

| 2003/0128326 A1 | 7/2003 | Yamaguchi et al. |
| 2008/0157364 A1* | 7/2008 | Yang ..................... G02F 1/1345 257/741 |

(Continued)

FOREIGN PATENT DOCUMENTS

| CN | 1743927 | 3/2006 |
| CN | 101718929 | 6/2010 |

(Continued)

OTHER PUBLICATIONS

Search report and Written Opinion, dated Jan. 20, 2016, for International Application No. PCT/CN2015/079599.
Office Action and Search Report, dated Mar. 20, 2017, for Chinese Patent Application No. 201510204304.4.

*Primary Examiner* — Cuong Q Nguyen
*Assistant Examiner* — Tong-Ho Kim
(74) *Attorney, Agent, or Firm* — Kim Winston LLP

(57) ABSTRACT

Disclosed are an array substrate and a display device which belong to the technical field of displays, and are intended to solve the technical problem of large width of the bezel of a liquid crystal display device. The array substrate is provided thereon with a fan-out zone which includes a plurality of conducting lines. At least one of the conducting lines includes a first metal wire and a second metal wire which are serially connected to each other. The second metal wire has a unit resistivity larger than that of the first metal wire. The conducting lines have different lengths, and the second metal wire in a shorter conducting line is longer than the second metal wire in a longer conducting line.

14 Claims, 2 Drawing Sheets

(51) Int. Cl.
  *H01L 27/12*    (2006.01)
  *G02F 1/1343*   (2006.01)
  *G02F 1/1333*   (2006.01)

(52) U.S. Cl.
  CPC ...... *H01L 27/124* (2013.01); *G02F 1/133345* (2013.01); *G02F 2001/13629* (2013.01); *G02F 2001/136295* (2013.01)

(58) Field of Classification Search
  CPC .......... G02F 2001/13629; G02F 2001/136295; H01L 27/124
  USPC .................................................. 257/72, 749
  See application file for complete search history.

(56) References Cited

U.S. PATENT DOCUMENTS

| | | | |
|---|---|---|---|
| 2013/0044044 A1 | 2/2013 | Ha et al. | |
| 2014/0291846 A1* | 10/2014 | Chai ..................... | G02F 1/1345 257/749 |
| 2015/0009438 A1* | 1/2015 | Du ........................ | G02F 1/1345 349/42 |

FOREIGN PATENT DOCUMENTS

| | | |
|---|---|---|
| CN | 103149753 | 6/2013 |
| CN | 203241671 | 10/2013 |
| CN | 104407477 | 3/2015 |
| JP | 2007142376 | 6/2007 |
| KR | 101252004 | 7/2008 |

* cited by examiner

ARRAY SUBSTRATE AND DISPLAY DEVICE

CROSS REFERENCE TO RELATED APPLICATIONS

The present application claims the priority of Chinese patent application CN201510204304.4, entitled "Array substrate and display device" and filed on Apr. 27, 2015, the entirety of which is incorporated herein by reference.

TECHNICAL FIELD

The present disclosure relates to the technical field of displays, and in particular, to an array substrate and a display device.

TECHNICAL BACKGROUND

With the development of display technology, liquid crystal display devices have become the most common display devices.

In a liquid crystal display device, images are displayed through control of pixels by criss-cross gate lines and data lines on array substrates. Gate drive signals and data signals are sent out from a control chip of the liquid crystal display device, and are transmitted respectively to gate lines and data lines on the array substrates through chip on films (COF).

Specifically, a COF is connected to a gate line or a data line of a display area by a group of fan-out lines which consist of a plurality of conducting lines. Because the fan-out lines are in a fan shape as a whole, the conducting lines on the right and left sides of the group of fan-out lines each have a length larger than that of the conducting lines in the middle of the group of fan-out lines, and further have a resistance larger than that of the conducting lines in the middle, which leads to distortion of waveforms of the gate drive signals or the data signals transmitted, thereby affecting the uniformity of drive signals.

As shown in FIG. 1, in the existing technologies, the conducting lines in the middle are usually arranged in fold lines, so that the conducting lines on two sides and the conducting lines in the middle of the fan-out zone 30 could have similar lengths and resistances, thereby improving the uniformity of the drive signals. However, the folding layout of conducting lines occupies a large space, and thus increases the width d of the bezel 20 of the display device, which goes against the current demand for narrow-bezel display devices.

SUMMARY OF THE INVENTION

The objective of the present disclosure is to provide an array substrate and display device, whereby the technical problem of large width of bezels of existing liquid crystal display devices can be solved.

The present disclosure provides an array substrate which is provided thereon with a fan-out zone. The fan-out zone comprises a plurality of conducting lines. At least one of the conducting lines comprises a first metal wire and a second metal wire which are in series connection, the second metal wire having a unit resistivity larger than that of the first metal wire. The conducting lines have different lengths. The second metal wire in a shorter conducting line is longer than the second metal wire in a longer conducting line.

Preferably, the array substrate comprises a first metal layer, a second metal layer, and a third metal layer.

Further, the second metal wire is located on the third metal layer.

Further, the first metal wire is located on the first metal layer or the second metal layer.

Preferably, the third metal layer has a thickness smaller than that of the first metal layer and smaller than that of the second metal layer.

Preferably, the second metal wire has a width smaller than that of the first metal wire.

Further, the first metal wire and the second metal wire are connected to each other by a transparent electrode.

Preferably, some of the conducting lines in the fan-out zone comprise only the first metal wire which comprises a single-layer metal segment and a double-layer metal segment which are serially connected to each other. The single-layer metal segment is located on the first metal layer or the second metal layer. The double-layer metal segment is formed by two metal layers connected in parallel and located on the first metal layer and the second metal layer respectively.

Further, the closer a conducting line is to the right or left side of the fan-out zone, the longer the double-layer metal segment in the first metal wire is.

The present disclosure further provides a display device comprising a color filter substrate and the above array substrate.

According to the present disclosure, the following beneficial effects are achieved. In the array substrate provided by the present disclosure, the conducting line in the fan-out zone may comprise the first metal wire and the second metal wire which are serially connected to each other, and the second metal wire has a unit resistivity larger than that of the first metal wire. By providing shorter conducting lines with longer second metal wires, resistances of the entire conducting lines can be adjusted, which enables the conducting lines having different lengths to have similar or even same resistances, thereby improving the uniformity of drive signals. In addition, in the present disclosure, each of the conducting lines can be arranged in a straight line, which will reduce the width of the bezel, thus satisfying the current demand for narrow-bezel display devices.

Other features and advantages of the present disclosure will be further explained in the following description, and partly become self-evident therefrom, or be understood through implementation of the present disclosure. The objectives and advantages of the present disclosure will be achieved through the structure specifically pointed out in the description, claims, and the accompanying drawings.

BRIEF DESCRIPTION OF THE DRAWINGS

For further illustrating the technical solutions provided in the embodiments of the present disclosure, a brief introduction will be provided below to the accompanying drawings involved in the embodiments.

DETAILED DESCRIPTION OF THE EMBODIMENTS

The present disclosure will be explained in detail with reference to the embodiments and the accompanying drawings, so that one can fully understand how the present disclosure solves the technical problem and achieves the technical effects by using the technical means thereof, and can thus implement the same. It should be noted that as long as there is no conflict, any of the embodiments and any of the technical features thereof may be combined with one another, and the technical solutions obtained therefrom all fall within the scope of the present disclosure.

Figure 1:
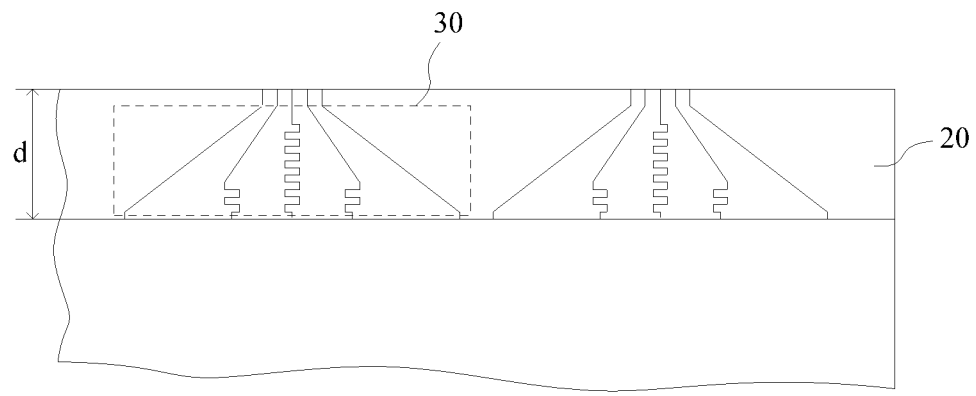
FIG. 1 schematically shows a fan-out line of an array substrate according to the existing technologies.
Figure 2:
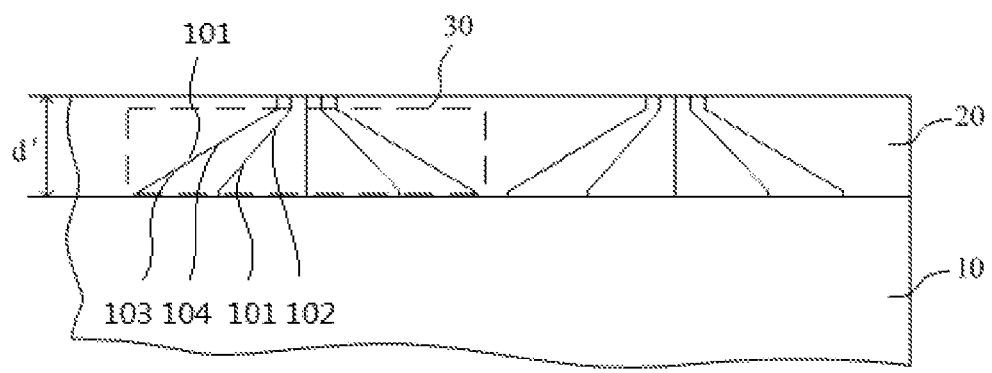
FIG. 2 schematically shows a fan-out line of an array substrate according to embodiments of the present disclosure.

As shown in FIG. 2, the present embodiment provides an array substrate which comprises a display area 10 and a bezel 20. The display area 10 is provided therein with a plurality of gate lines and data lines (not shown in FIG. 2). The bezel 20 is provided is provided therein with a plurality of fan-out zones 30. In the present embodiment, fan-out lines in a fan-out zone 30 as shown in the Figs. are seen as a group of fan-out lines.

Each fan-out zone 30 comprises a plurality of conducting lines. At least one of the conducting lines comprises a first metal wire 101 and a second metal wire 102 which are serially connected to each other. The second metal wire 102 has a unit resistivity larger than that of the first metal wire. The conducting lines have different lengths. The second metal wire in a shorter conducting line is longer than the second metal wire in a longer conducting line.

In the present embodiment, the conducting lines on the right and left sides of the fan-out zone 30 are provided therein only with the first metal wire 101, and are not provided with the second metal wire. The closer a conducting layer is to the middle of the fan-out zone 30, the shorter the conducting line is, and the longer the second metal wire 102 of the conducting line is.

It should be noted that a conducting line may comprise one segment of the first metal wire 101 and one segment of the second metal wire 102 which are serially connected to each other, and may also comprise several segments of the first metal wire 101 and several segments of the second metal wire 102 which are serially connected to one another.

In the array substrate provided by the embodiments of the present disclosure, by providing shorter conducting lines with longer second metal wires 102, the resistances of the entire conducting lines can be generally adjusted, which enables the conducting lines having different lengths in the fan-out zone 30 to have similar or even same resistances, thereby improving the uniformity of drive signals. In addition, each of the conducting lines in the fan-out zone 30 can be arranged in a straight line, which will reduce the width d' of the bezel, thus satisfying the current demand for narrow-bezel display devices.

Figure 3A:
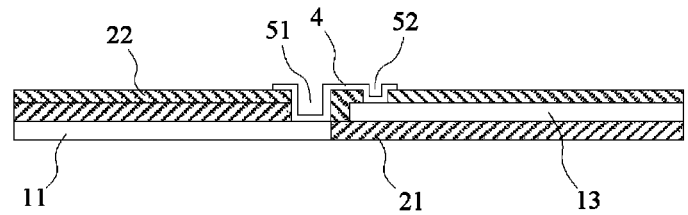
FIGS. 3a to 3c schematically show three types of conducting lines of the fan-out line of the array substrate according to embodiment 1 of the present disclosure.
Figure 3B:
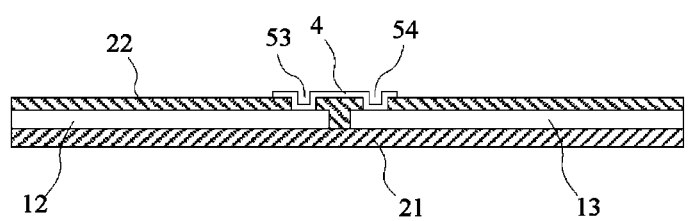
Figure 3C:
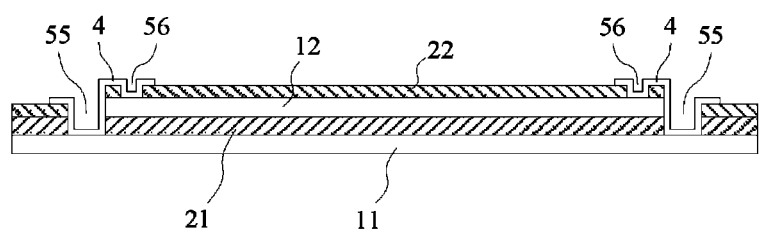

As shown in FIGS. 3a, 3b, and 3c, in a preferred embodiment, the array substrate provided by the present disclosure may comprise a first metal layer 11, a first insulating layer 21, a second metal layer 12, a second insulating layer 22, and a third metal layer 13. The first metal layer 11 is a gate metal layer which mainly comprises gate scan lines and common electrode lines. The second metal layer 12 is a source-drain metal layer which mainly comprises data lines. Besides, the present disclosure provides another metal layer, i.e., the third metal layer 13, which acts to form the second metal wires in the fan-out zone 30.

As shown in FIG. 3a, in the present embodiment, the second metal wire is located on the third metal layer 13. The first metal wire is located on the first metal layer 11. The first metal wire and the second metal wire are connected to each other by a transparent electrode 4 which is formed preferably of an indium tin oxide (ITO). Specifically, a through hole 51 running through the first insulating layer 21 and the second insulating layer 22 is formed at the top of the first metal wire. A through hole 52 running through the second insulating layer 22 is formed at the top of the second metal wire. The first metal wire and the second metal wire are serially connected to each other by the transparent electrode 4 which goes through the through holes 51 and 52.

Alternatively, as shown in FIG. 3b, the first metal wire also can be located on the second metal layer 12. The first metal wire and the second metal wire are connected to each other by the transparent electrode 4. Specifically, a through hole 53 running through the second insulating layer 22 is formed at the top of the first metal wire. A through hole 54 running through the second insulating layer 22 is formed at the top of the second metal wire. The first metal wire and the second metal wire are connected to each other by the transparent electrode 4 which goes through the through holes 53 and 54.

In the present embodiment, the third meal layer 13 has a thickness smaller than that of the first metal layer 11 and smaller than that of the second metal layer 12. Therefore, the second metal wire located on the third metal layer 13 has a smaller cross-section and consequently a larger unit resistivity. Alternatively, the second metal wire may have a width smaller than that of the first metal wire, which will also enable the second metal wire to have a smaller cross-section and consequently a larger unit resistivity. Alternatively, the third metal layer 13 can be formed of a material with high resistivity, which can render a larger resistivity of the second metal wire.

As shown in FIG. 3c, in the present embodiment, the conducting lines on the right and left sides of the fan-out zone 30 are provided therein only with the first metal wire, and are not provided with the second metal wire. Said first metal wire is formed by two metal layers located on the first metal layer 11 and the second metal layer 12 respectively and connected in parallel. Said two metal layers are connected to each other by the transparent electrode 4. Such arrangement can reduce resistances of the entire conducting lines, and enables the conducting lines to have resistances closer to the conducting lines in the middle of the fan-out zone 30, thereby improving the quality of the transmitted drive signals. Specifically, through holes 55 running through the first insulating layer 21 and the second insulating layer 22 are formed at the top of the first metal layer 11. Through holes 56 running through the second insulating layer 22 are formed at the top of the second metal layer 12. The first metal layer 11 and the second metal layer 12 are connected to each other in parallel by the transparent electrode 4 which goes through the through holes 55 and 56.

A value of a resistance Ra of the conducting line as shown in FIG. 3a or 3b can be expressed by the following formula:

$$Ra = L1 \cdot R1 + L2 \cdot R2$$

where L1 refers to the length of the first metal wire, R1 refers to the resistance per unit length of the first metal wire (provided that the first metal layer 11 and the second metal layer 12 have the same unit resistivity), L2 refers to the length of the second metal wire, and R2 refers to the resistance per unit length of the second metal wire.

Besides, the length La of the conducting line can be expressed by the following formula:

$$La = L1 + L2$$

A value of a resistance Rb of the conducting line as shown in FIG. 3c can be expressed by the following formula:

$$Rb = Lb \cdot \frac{R1 \cdot R1}{R1 + R1} = Lb \cdot R1/2$$

where Lb refers to the length of the conducting line, R1 refers to the resistance per unit length of the first metal layer 11 and the second metal layer 12 (provided that the first metal layer 11 and the second metal layer 12 have the same unit resistivity).

In conclusion, in the preferred embodiment, Ra=Rb can be achieved by providing the conducting lines in the middle of the fan-out zone 30 with a serially connected second metal wire having larger a resistance per unit length, and providing the first metal wires of the conducting lines on the right and left sides of the fan-out zone 30 by connecting the two metal layers in parallel. Thus, based on the above formulas, the following formula can be obtained.

$$Lb = 2\left(L1 + L2 \cdot \frac{R2}{R1}\right)$$

Because R2>R1, Lb>2La.

Therefore, in the embodiments of the present disclosure, by adjusting the resistances of the conducting lines in the fan-out zone 30, each of the conducting lines can be straight lines and the resistances of each of the entire conducting lines can be close to one another or be the same. This, specifically, can be achieved by the following two methods.

As shown in FIGS. 3a and 3b, the second metal wire with a higher resistance per unit length is serially connected. For conducting lines which are closer to the middle of the fan-out zone 30, the second metal wires thereof are longer, which enables the resistances of the conducting lines to be larger, thereby reducing or eliminating differences in resistance resulting from the shortness of the conducting lines. In this manner, the conducting lines in the middle can be shortened. The lengths of the second metal wires can be adjusted based on the specific lengths of the conducting lines, so that all the conducting lines in the fan-out zone 30 can be arranged in straight lines and have similar or the same resistances.

As shown in FIG. 3c, some of the conducting lines in the fan-out zone 30 may comprise only the first metal wire 101 which comprises single-layer metal segments 103 and double-layer metal segments 104 which are in series connection. The single-layer metal segment 103 is located on the first metal layer or the second metal layer. The double-layer metal segment 104 is formed by two metal layers connected in parallel and located on the first metal layer and the second metal layer respectively. In other words, the first metal wire is formed by two or more metal layers connected in parallel. For the conducting lines which are closer to the right or left side of the fan-out zone 30, the double-layer metal segments of the first metal wires thereof are longer, which enables the double-layer metal segments in the first metal wires to occupy a larger portion than the single-layer metal segments, thereby decreasing or eliminating increment in resistance resulting from the large length of the conducting lines on the right and left side of the fan-out zone. Similarly, length ratio of the double-layer metal segments in the first metal wires can be adjusted based on the specific lengths of the conducting lines, so that all the conducting lines in the fan-out zone 30 can be arranged in straight lines and have similar or the same resistances.

For the whole fan-out zone 30, the adjustment of the resistances of the conducting lines can be achieved by using the above two methods at the same time, which are specifically shown in the preferred embodiment of the present disclosure, or using either of the two methods, as long as it can achieve the technical effect that each of the conducting lines in the fan-out zone 30 is arranged in a straight line, and all the conducting lines have similar or same resistances.

In addition, it should be understood that for each conducting line, it can be manufactured by using the above two methods at the same time. That is, a part of the conducting line is provided with a structure as shown in FIG. 3c, and other parts thereof are provided with a structure as shown in FIG. 3a or 3b.

Compared with the existing technologies, the technical solutions provided by the embodiments of the present disclosure are able to reduce the space occupied by the conducting lines, and avoid the waste of spaces caused by the fold line design in the existing technologies, thus decreasing the width of the bezel of the array substrate, and further satisfying the current demand for narrow-bezel display devices.

Furthermore, the technical solutions provided by the embodiments of the present disclosure may be combined with the existing technologies. On the premise of not increasing the width of the bezel, a plurality of conducting lines in the fan-out zone can be partly structured in the form of an arch to increase the resistances thereof, thereby improving the uniformity of drive signals. By using the idea of the present disclosure, the proportion of the arch-form conducting lines can be distinctly reduced, which is helpful to form a narrow bezel.

The present embodiment provides a display device which can be used in liquid crystal televisions, liquid crystal display devices, mobile phones, tablet PCs, etc. The display device comprises a color filter substrate and the array substrate provided by the above embodiments.

The display device provided by the present embodiment has same technical features as the array substrate provided by the above embodiments, and therefore is able to solve the same technical problem and achieve the same technical effects as the array substrate provided by the above embodiments does.

The above embodiments are described only for better understanding, rather than restricting the present disclosure. Anyone skilled in the art can make amendments to the implementing forms or details without departing from the spirit and scope of the present disclosure. The scope of the present disclosure should still be subject to the scope defined in the claims.

The invention claimed is:

1. An array substrate, which is provided thereon with a fan-out zone,
   wherein the fan-out zone comprises a plurality of conducting lines, at least one of the conducting lines comprising a first metal wire and a second metal wire which are in series connection, the second metal wire having a unit resistivity larger than that of the first metal wire, and
   the conducting lines have different lengths, the second metal wire in a shorter conducting line being longer than the second metal wire in a longer conducting line,
   wherein the array substrate comprises a first metal layer, a second metal layer, and a third metal layer,
   wherein some of the conducting lines in the fan-out zone comprise only the first metal wire which comprises a single-layer metal segment and a double-layer metal segment which are in series connection, and wherein the single-layer metal segment is located on the first metal layer or the second metal layer, and the double-layer metal segment is formed by two metal layers connected in parallel and located on the first metal layer and the second metal layer respectively.

2. The array substrate according to claim 1, wherein the second metal wire is located on the third metal layer.

3. The array substrate according to claim 2, wherein the first metal wire is located on the first metal layer or the second metal layer.

4. The array substrate according to claim 3, wherein the third metal layer has a thickness smaller than that of the first metal layer and smaller than that of the second metal layer.

5. The array substrate according to claim 3, wherein the second metal wire has a width smaller than that of the first metal wire.

6. The array substrate according to claim 1, wherein the first metal wire and the second metal wire are connected to each other by a transparent electrode.

7. The array substrate according to claim 1, wherein the closer a conducting line is to the right or left side of the fan-out zone, the longer the double-layer metal segment in the first metal wire is.

8. A display device, comprising a color filter substrate and an array substrate, wherein the array substrate is provided thereon with a fan-out zone, the fan-out zone comprises a plurality of conducting lines, at least one of the conducting lines comprising a first metal wire and a second metal wire which are in series connection, the second metal wire having a unit resistivity larger than that of the first metal wire, and the conducting lines have different lengths, the second metal wire in a shorter conducting line being longer than the second metal wire in a longer conducting line, wherein the array substrate comprises a first metal layer, a second metal layer, and a third metal layer, wherein some of the conducting lines in the fan-out zone comprise only the first metal wire which comprises a single-layer metal segment and a double-layer metal segment which are in series connection, and wherein the single-layer metal segment is located on the first metal layer or the second metal layer, and the double-layer metal segment is formed by two metal layers connected in parallel and located on the first metal layer and the second metal layer respectively.

9. The display device according to claim 8, wherein the second metal wire is located on the third metal layer.

10. The display device according to claim 9, wherein the first metal wire is located on the first metal layer or the second metal layer.

11. The display device according to claim 10, wherein the third metal layer has a thickness smaller than that of the first metal layer and smaller than that of the second metal layer.

12. The display device according to claim 10, wherein the second metal wire has a width smaller than that of the first metal wire.

13. The display device according to claim 8, wherein the first metal wire and the second metal wire are connected to each other by a transparent electrode.

14. The display device according to claim 8, wherein the closer a conducting line is to the right or left side of the fan-out zone, the longer the double-layer metal segment in the first metal wire is.

* * * * *